(12) United States Patent
Kopaczewski et al.

(10) Patent No.: US 11,784,486 B2
(45) Date of Patent: Oct. 10, 2023

(54) LOW-VOLTAGE CIRCUIT BREAKER AND POWER MEASURING ARRANGEMENT

(71) Applicant: Siemens Aktiengesellschaft, Munich (DE)

(72) Inventors: Peter Kopaczewski, Berlin (DE); Marco Bruell, Berlin (DE)

(73) Assignee: Siemens Aktiengesellschaft, Munich (DE)

(*) Notice: Subject to any disclaimer, the term of this patent is extended or adjusted under 35 U.S.C. 154(b) by 38 days.

(21) Appl. No.: 17/680,628

(22) Filed: Feb. 25, 2022

(65) Prior Publication Data

US 2022/0271524 A1    Aug. 25, 2022

(30) Foreign Application Priority Data

Feb. 25, 2021   (DE) .................. 10 2021 201 810.6

(51) Int. Cl.
*H02H 3/08*   (2006.01)
*H02H 1/00*   (2006.01)
(Continued)

(52) U.S. Cl.
CPC ............. *H02H 3/08* (2013.01); *G01R 15/181* (2013.01); *G01R 19/16571* (2013.01); *G01R 21/06* (2013.01); *H02H 1/0007* (2013.01)

(58) Field of Classification Search
CPC ...... H02H 1/0007; H02H 3/08; G01R 15/181; G01R 19/16571; G01R 21/06
(Continued)

(56) References Cited

U.S. PATENT DOCUMENTS

2008/0191657 A1* 8/2008 Ichiki .................. H02P 23/26
                                                             318/729
2010/0235122 A1* 9/2010 McCrea ............... G01R 21/133
                                                             324/140 R
(Continued)

FOREIGN PATENT DOCUMENTS

DE    102012107021 B4    10/2014
DE    102015218914 A1 *   1/2017
(Continued)

OTHER PUBLICATIONS

Machine translation of Adlhoch German Patent Document DE 10 2015218914 A1 Jan. 5, 2017 (Year: 2017).*

*Primary Examiner* — Kevin J Comber
(74) *Attorney, Agent, or Firm* — Laurence A. Greenberg; Werner H. Stemer; Ralph E. Locher

(57) ABSTRACT

A power value for a low-voltage AC circuit, such as low-voltage circuit breaker, is derived. A voltage between conductors of the low-voltage AC circuit is ascertained and a current of at least one conductor is ascertained by a Rogowski coil, which outputs an analog voltage that is an equivalent to the level of the electric current. The analog voltage of the Rogowski coil is integrated and then digitized, and the level of the voltage is digitized. A power value is calculated in each case from a sample value of the current and an interpolated voltage value. The interpolated voltage value is in each case ascertained from two successive sample values of the voltage such that a phase error generated by the Rogowski coil or/and the integrator is compensated for in relation to the electric current in the conductor and a phase error-free power value is ascertained.

15 Claims, 2 Drawing Sheets

(51) Int. Cl.
  *G01R 21/06* (2006.01)
  *G01R 19/165* (2006.01)
  *G01R 15/18* (2006.01)
(58) Field of Classification Search
  USPC .......................................................... 361/87
  See application file for complete search history.

(56) References Cited

U.S. PATENT DOCUMENTS

2016/0178673 A1\* 6/2016 Borgwardt ......... G01R 19/2509
                                                            324/120
2017/0138986 A1\* 5/2017 Kern .................... G01R 15/181

FOREIGN PATENT DOCUMENTS

DE     102015218914 A1    1/2017
DE     102016218960 A1    4/2018

\* cited by examiner

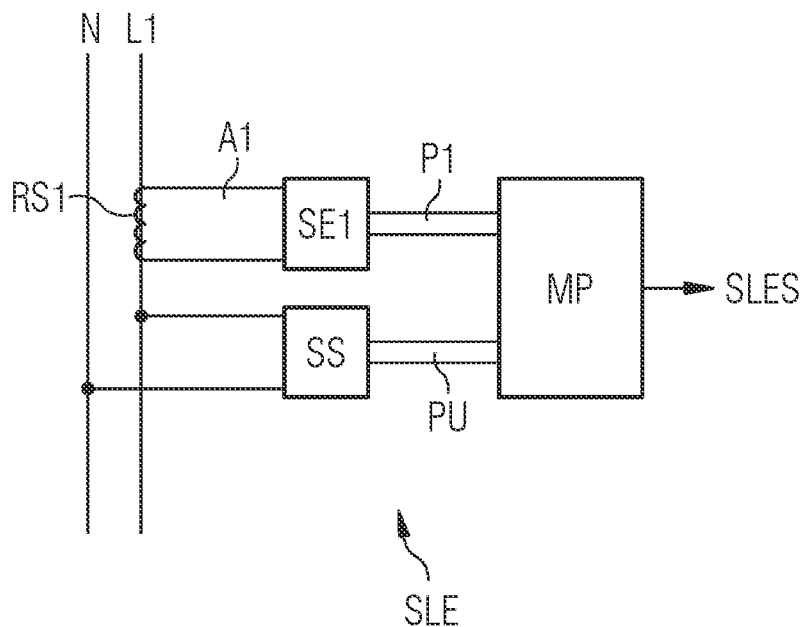
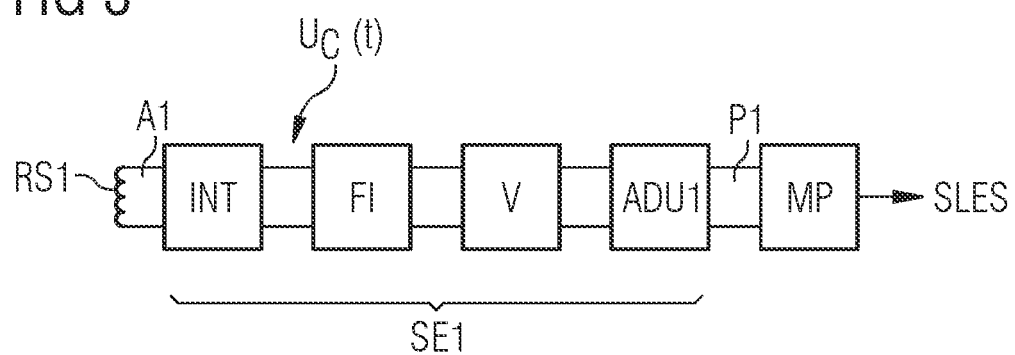
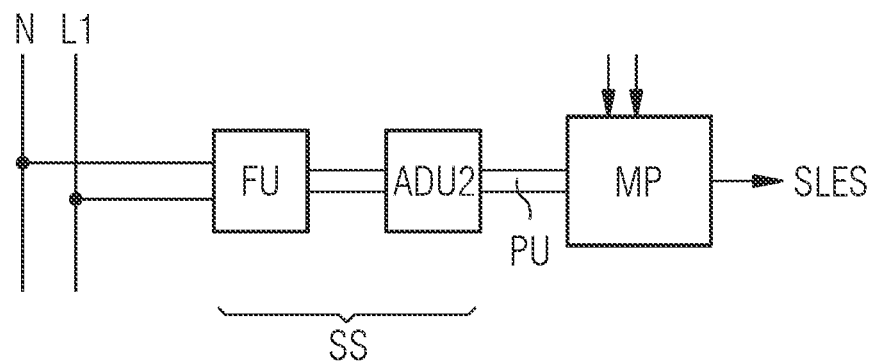

US 11,784,486 B2

LOW-VOLTAGE CIRCUIT BREAKER AND POWER MEASURING ARRANGEMENT

CROSS-REFERENCE TO RELATED APPLICATION

This application claims the priority, under 35 U.S.C. § 119, of German Patent Application DE 10 2021 201 810.6, filed Feb. 25, 2021; the prior application is herewith incorporated by reference in its entirety.

FIELD AND BACKGROUND OF THE INVENTION

The invention relates to the technical field of a low-voltage circuit breaker for a low-voltage AC circuit, a power measuring arrangement for a low-voltage AC circuit, in particular for low-voltage circuit breakers, and a method for ascertaining a power for a low-voltage AC circuit, in particular for a low-voltage circuit breaker.

Circuit breakers are protection devices, which function in a similar way to a fuse. Circuit breakers monitor the current flowing through them by way of a conductor and interrupt the electric current or flow of energy to an energy sink or a load, which is referred to as tripping, when protection parameters, such as current limit values or current/time period limit values, that is to say when a current value is present for a certain time period, are exceeded. The set current limit values or current/time period limit values are corresponding reasons for tripping. Interruption is performed, for example, by contacts of the circuit breaker, which are opened.

Particularly for low-voltage circuits, installations or supply systems, there are various types of circuit breakers, depending on the level of the provided electric current in the electrical circuit. Within the meaning of the invention, circuit breakers are understood to mean in particular switches as are used in low-voltage installations for currents, in particular rated currents or maximum currents, of from 63 to 6300 amperes. Molded case circuit breakers are especially used for currents of from 63 to 1600 amperes, in particular of from 125 to 630 or 1200 amperes. Air circuit breakers are used, in particular, for currents of from 200 or 630 to 6300 amperes, especially of from 1200 to 6300 amperes.

Air circuit breakers are also termed ACB for short and molded case circuit breakers are termed MCCB for short.

Low voltage is understood to mean voltages of up to 1000 or 1200 volts AC or 1500 volts DC, the root mean square values of the voltage in particular being meant here. Low voltage is more specifically understood to mean, in particular, voltages greater than extra-low voltage, with values of 50 volts AC or 120 volts DC.

Within the meaning of the invention, circuit breakers are understood to mean circuit breakers with an electronic trip unit, ETU for short, which serves as a control unit.

In low-voltage circuit breakers, the level of the voltage is usually ascertained by way of voltage sensors. So-called Rogowski coils (Rogowski transformers) are usually used to ascertain the level of the currents. The Rogowski coils output a voltage proportional to the differential current. The level of the current may be ascertained by integrating the voltage.

Rogowski coils have the disadvantage that the ascertained level of the current is not accurate in terms of phase. This is caused by the stray field inductance of the coil of the Rogowski coil. Furthermore, the Rogowski transformer, like the integrator, does not involve ideal units, but rather real units. Following the signal derivation by the Rogowski transformer and the subsequent integration by an analog integrator, there is a resultant (residual) phase error in relation to the original signal (current to be ascertained in the conductor). The phase error in the current measurement path distorts all current measured values. Resultant variables, such as a power value, in which the current ascertained by a Rogowski coil (or/and integrator) is used and which are dependent for example on the phase angle between current and voltage, are therefore distorted.

However, Rogowski coils have the advantage that they have potential isolation, high current stability and a small structural size.

SUMMARY OF THE INVENTION

It is accordingly an object of the invention to provide a low voltage power switch and a power measurement apparatus which overcomes the above-mentioned disadvantages of the heretofore-known devices and methods of this general type and which provides for an accurate ascertainment of variables, in particular of power values, based on current and voltage values using Rogowski coils to ascertain the current, in particular for a low-voltage circuit breaker.

With the above and other objects in view there is provided, in accordance with the invention, a low-voltage circuit breaker for a low-voltage AC circuit, the circuit breaker comprising:

a voltage sensor for ascertaining a voltage between conductors of the low-voltage AC circuit;

a Rogowski coil for ascertaining an electric current of a conductor of the low-voltage AC circuit, the Rogowski coil outputting an analog voltage that is an equivalent of a level of the electric current of the conductor;

an interruption unit having contacts for interrupting the low-voltage AC circuit;

a control unit connected to said voltage sensor, to said Rogowski coil, and to said interruption unit, said control unit having a microprocessor, wherein the low-voltage AC circuit is interrupted when at least one of a current limit value or a current/time period limit value of a conductor are exceeded;

said Rogowski coil being connected to an analog integrator followed by a first analog-to-digital converter configured to convert an integrated analog voltage) into a digital signal, to provide a sample value of the current every X degrees, in relation to the period duration of the AC current;

said voltage sensor being connected to a second analog-to-digital converter, providing a sample value of the voltage every Y degrees, in relation to the period duration of the AC voltage, with the sample value of the voltage corresponding to a level of the voltage or an equivalent of the level of the voltage at the respective time; and wherein a power value is calculated in each case from a sample value of the current and an interpolated voltage value, the interpolated voltage value in each case being ascertained from two successive sample values of the voltage such that a phase error generated by at least one of the Rogowski coil or the integrator is compensated for in relation to the electric current in the conductor, to ascertain an at least substantially phase error-free power value.

In other words, the objects of the invention are achieved by way of a low-voltage circuit breaker, by way of a measurement apparatus for a low-voltage AC circuit, and by way of a method, as claimed. By way of example, according to the invention, there is provided a low-voltage circuit breaker for a low-voltage AC circuit, having:
- (at least) one voltage sensor for ascertaining the level of the voltage between conductors of the low-voltage AC circuit,
- (at least) one Rogowski coil for ascertaining the level of the electric current of a conductor of the low-voltage AC circuit, which Rogowski coil outputs an analog voltage that is an equivalent of the level of the electric current of the conductor,
- an interruption unit having contacts for interrupting the low-voltage AC circuit,
- a control unit connected to the voltage sensor, the Rogowski coil and the interruption unit, having a microprocessor, wherein the low-voltage circuit breaker is designed such that interruption of the low-voltage AC circuit is prompted when current or/and current/time period limit values of a conductor are exceeded. The low-voltage circuit breaker is furthermore designed such that:
- (each or) the Rogowski coil is connected to an analog integrator followed by a first analog-to-digital converter that converts the integrated analog voltage into a digital signal, such that a sample value of the current is present every X degrees (that is to say a determined fixed number of degrees), in relation to the period duration of the AC current)(360° (a first number of digital sample values of the AC current are present in relation to a period duration of the AC current)
- the voltage sensor is connected to a second analog-to-digital converter, such that a sample value of the voltage is present every Y degrees (that is to say a determined fixed number of degrees), in relation to the period duration of the AC voltage)(360° (a first or second number of digital sample values of the AC voltage are present in relation to a period duration of the AC voltage), which sample value corresponds to the level of the voltage or an equivalent of the level of the voltage at the respective time,
- a power value is calculated in each case from a sample value of the current and an interpolated voltage value, wherein the interpolated voltage value is in each case ascertained from two successive sample values of the voltage, and a phase error generated by the Rogowski coil or/and the integrator (that is to say the arrangement for ascertaining the level of the current—for example Rogowski coil, integrator and possibly further units) is compensated for in relation to the electric current in the conductor, such that an at least roughly phase error-free power value is ascertained.

In other words, for example, an interpolated voltage value is ascertained, in each case from two successive sample values of the voltage, for a phase angle between them, thereby giving interpolated voltage values. A power value is calculated from a sample value at a phase angle of the first number of sample values of the current and an interpolated voltage value of the same phase angle, such that a power is ascertained using sample values of the current and interpolated voltage values of matching phase angle, in order to compensate for a phase error when ascertaining the current value.

According to the invention, the phase error is in this case advantageously not compensated on the side of the current signal (which causes or contains the phase error), but rather the voltage signal is used to compensate for the phase error (of the current). Since the voltage signal is present only in discrete time intervals, which possibly do not correlate with the level of the phase error, interpolated voltage values are ascertained, these then correlating with the (phase error-impacted) current values, such that, for a phase angle of current and voltage, the current and voltage values present for this phase angle (that is to say the phase angle-impacted current value and an—interpolated—voltage value correlated therewith) are used, such that an error in a power value calculated from the values is avoided or minimized.

It has proven in particular that it is more advantageous to compensate for the voltage value, since this often contains fewer harmonics. The voltage measurement path (voltage sensor) furthermore usually contains only linear components, as a result of which runtime or/and phase errors cannot occur here or are minimized to a great extent.

Advantageous embodiments of the invention are specified in the dependent claims.

In one advantageous embodiment of the invention, the low-voltage circuit breaker is designed such that the interpolated voltage values are ascertained by way of a linear interpolation.

This has the particular advantage of allowing particularly simple and inexpensive interpolation of the voltage values.

In one advantageous embodiment of the invention, the low-voltage circuit breaker is designed such that the interpolation is performed in the control unit, in particular in the microprocessor.

This has the particular advantage of allowing simple and inexpensive interpolation, for example in firmware, which is additionally easily able to be adapted.

In one advantageous embodiment of the invention, the low-voltage circuit breaker is designed such that the sample value of the current and the sample value of the voltage are each ascertained at the same time or at roughly the same time.

This has the particular advantage that an ascertained phase error of the current is able to be used directly as phase difference to ascertain or interpolate the (interpolated) voltage value.

In one advantageous embodiment of the invention, the low-voltage circuit breaker is designed such that the sample value of the current and the sample value of the voltage are ascertained at the same sampling rate, such that the time difference between the sample values of the current and the sample values of the voltage is the same or the same on average.

This has the particular advantage of avoiding compensating for different sampling rates and thus different time intervals in addition to the phase error correction.

In one advantageous embodiment of the invention, the low-voltage circuit breaker is designed such that the phase error of the current is ascertained in particular when the low-voltage circuit breaker is put into service, that the phase position of the interpolated voltage value, in particular when the low-voltage circuit breaker is put into service, is set such that at least roughly phase error-free power values are ascertained.

This has the particular advantage that a comparison is performed upon putting into service, such that no further comparison is necessary for a first accuracy requirement.

According to the invention, a parallel power measuring arrangement for a low-voltage AC circuit is also claimed. Said power measuring arrangement has:
- a voltage sensor for ascertaining the level of the voltage between conductors of the low-voltage AC circuit,
- a Rogowski coil for ascertaining the level of the electric current of a conductor of the low-voltage AC circuit, which Rogowski coil outputs an analog voltage that is an equivalent of the level of the electric current of the conductor, a control unit connected to the voltage sensor and the Rogowski coil, having a microprocessor, wherein the power measuring arrangement is designed such that:

the Rogowski coil is connected to an analog integrator followed by a first analog-to-digital converter that converts the integrated analog voltage into a digital signal, such that a sample value of the current is present every X degrees, in relation to the period duration of the AC current, the voltage sensor is connected to a second analog-to-digital converter, such that a sample value of the voltage is present every Y degrees, in relation to the period duration of the AC voltage, which sample value corresponds to the level of the voltage or an equivalent of the level of the voltage at the respective time, a power value is calculated in each case from a sample value of the current and an interpolated voltage value, wherein the interpolated voltage value is in each case ascertained from two successive sample values of the voltage such that a phase error generated by the Rogowski coil or/and the integrator is compensated for in relation to the electric current in the conductor, such that an at least roughly phase error-free power value is ascertained.

The above-mentioned advantages and benefits are equally applicable to this embodiment of the invention. Also, the dependent claims in relation to the low-voltage circuit breaker apply analogously to the power measuring arrangement.

With the above and other objects in view there is also provided, in accordance with the invention, a method for ascertaining a power value for a low-voltage AC circuit, in particular for a low-voltage circuit breaker. In accordance with the novel method, the level of the voltage between conductors of the low-voltage AC circuit is ascertained, the level of the current of at least one conductor is ascertained by a Rogowski coil, which outputs an analog voltage that is an equivalent of the level of the electric current of the conductor, the analog voltage of the Rogowski coil is integrated and then digitized, such that a sample value of the current or an equivalent thereof is present every X degrees, in relation to the period duration of the AC current, the level of the voltage is digitized, such that a sample value of the voltage or an equivalent thereof is present every Y degrees, in relation to the period duration of the AC voltage, a power value is calculated in each case from a sample value of the current and an interpolated voltage value, wherein the interpolated voltage value is in each case ascertained from two successive sample values of the voltage such that a phase error generated by the Rogowski coil or/and the integrator is compensated for in relation to the electric current in the conductor, such that an at least roughly phase error-free power value is ascertained.

This has the advantages that have already been described. It should also be understood that the dependent claims that relate to the low-voltage circuit breaker apply analogously to the method.

According to the invention, again advantageously, a computer program product comprising commands that, when the program is executed by a microprocessor, prompt said microprocessor to generate/to ascertain/to calculate an—at least roughly, i.e., substantially—phase error-free power value is claimed.

The computer program product may advantageously be stored on a computer-readable storage medium, such as a CD, floppy disk, USB stick, etc. in order for example to allow retrospective updating of the firmware of a microprocessor of a low-voltage circuit breaker or a power measuring arrangement.

The computer program product may advantageously be transmitted by a data carrier signal, in order for example to allow fast installation of the firmware on the microprocessor. In that case, claim is made to the program itself that is modulated onto the carrier signal, to the installation of the program on the microcomputer, and also to the originating data storage medium from which the program originates.

All embodiments herein described, and various further combinations, bring about an improvement when ascertaining variables from voltage and current measured values in which Rogowski coils are used.

The described properties, features and advantages of this invention and the manner in which they are achieved become more clearly and distinctly comprehensible in conjunction with the following description of the exemplary embodiments, which are explained in more detail in connection with the drawing. That is, the construction and method of operation of the invention, together with additional objects and advantages thereof will be best understood from the following description of specific embodiments when read in connection with the accompanying drawings.

BRIEF DESCRIPTION OF THE FIGURES

FIG. 2 shows a block diagram of a power measuring arrangement;

FIG. 3 shows a first arrangement according to the invention; and

FIG. 4 shows a second arrangement according to the invention.

DETAILED DESCRIPTION OF THE INVENTION

Figure 1:
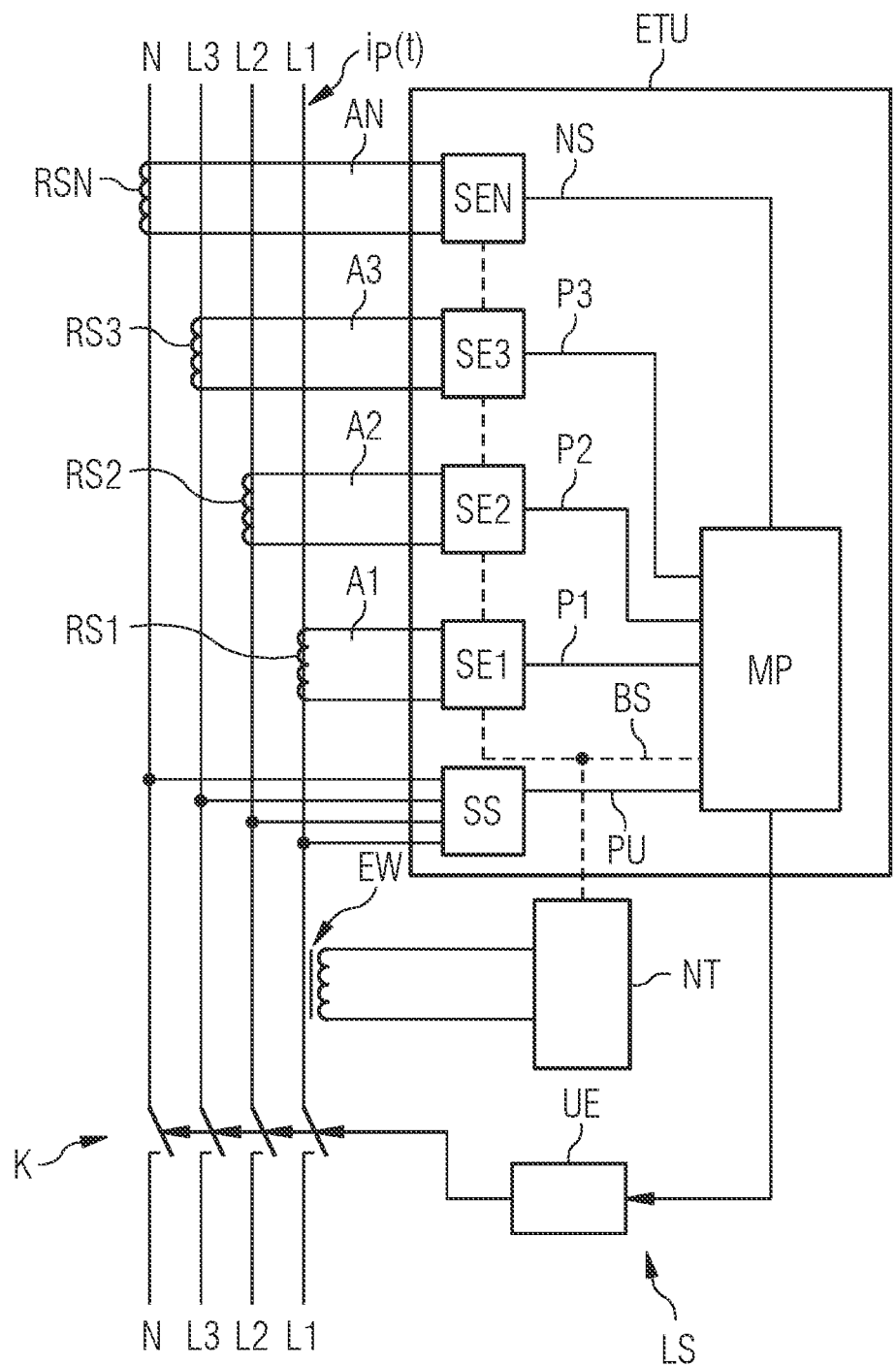
FIG. 1 shows a block diagram of a low-voltage circuit breaker.

Referring now to the figures of the drawing in detail and first, in particular, to FIG. 1 thereof, there is shown a schematic block diagram of a low-voltage circuit breaker LS. FIG. 1 shows electrical conductors L1, L2, L3, N of a low-voltage circuit, for example a three-phase AC circuit, wherein the first conductor L1 forms the first phase with the first phase current ip(t), the second conductor L2 forms the second phase with the second phase current, the third conductor L3 forms the third phase with the third phase current and the fourth conductor forms the neutral conductor N with the neutral conductor current of the three-phase AC circuit.

In the example according to FIG. 1, the first conductor L1 is connected to an energy converter EW (for example as part of a set of converters) in such a way that at least a portion of the current, that is to say a partial conductor current, or the entire current of the first conductor L1 flows through a primary side of the energy converter EW. A conductor, in the example the first conductor L1, usually forms the primary side of the energy converter EW. The energy converter EW is usually a transformer with a core, for example an iron core transformer. In one embodiment, an energy converter EW may be provided in each phase or in each conductor of the electrical circuit. The secondary side of the energy converter EW or each provided energy converter is connected to a power supply NT (or multiple power supplies), which makes available a supply of energy, for example a dedicated supply, for example in the form of a supply voltage, for the units of the low-voltage circuit breaker, in particular an electronic trip unit ETU, illustrated by a dashed connection of operating voltage conductors BS. The power supply NT may additionally also be connected to at least one or all current units SE1, SE2, SE3, SEN in order to supply energy to the current units—if necessary.

Each current unit SE1, SE2, SE3, SEN is connected to a Rogowski coil RS1, RS2, RS3, RSN in order to ascertain the level of the electric current of the conductor, assigned thereto, of the electrical circuit. In the example, the first current unit SE1 is assigned to the first conductor L1, that is to say the first phase; the second current unit SE2 is assigned to the second conductor L2, that is to say the second phase; the third current unit SE3 is assigned to the third conductor L3, that is to say the third phase; the fourth current unit SEN is assigned to the neutral conductor N (fourth conductor).

The Rogowski coils RS1, RS2, RS3, RSN, at their outputs, deliver an analog voltage A1, A2, A3, AN proportional to the level of the conductor current. This is supplied to the first to fourth current units SE1, SE2, SE3, SEN. In the example, the first to fourth current units SE1, SE2, SE3, SEN are part of a control unit ETU. However, they may also be provided as one or more separate units.

The current units SE1, SE2, SE3, SEN are used to process the voltage of the respective Rogowski coils. The current units SE1, SE2, SE3, SEN deliver for example a digital signal P1, P2, P3, NS to a microprocessor MP that is provided for example in the electronic trip unit ETU.

The transmitted digital signals P1, P2, P3, NS are compared, in the electronic trip unit ETU, with current limit values or/and current/time period limit values, which form reasons for tripping. If said limit values are exceeded, interruption of the electrical circuit is prompted. This forms overcurrent or/and short-circuit protection. This may be achieved for example by providing an interruption unit UE that is connected on one side to the electronic trip unit ETU and on the other side has contacts K for interrupting the conductors L1, L2, L3, N or further conductors. The interruption unit UE in this case receives an interruption signal for opening the contacts K.

The low-voltage circuit breaker LS furthermore has a voltage sensor SS. This may be either a separate unit or part of the control unit ETU, as illustrated in FIG. 1. The voltage sensor SS is connected to the conductors L1, L2, L3, N. The voltage sensor SS is also connected to the control unit ETU or the microprocessor MP.

FIG. 2 shows a basic power measuring arrangement SLE, with units according to FIG. 1 being provided. The power measuring arrangement SLE has at least one Rogowski coil RS1 for ascertaining the level of the electric current of a conductor L1 of the low-voltage AC circuit, which Rogowski coil outputs an analog voltage A1 that is an equivalent of the level of the electric current of the conductor L1. The Rogowski coil RS1 is connected to a current unit SE1.

It furthermore has at least one voltage sensor SS for ascertaining the level of the voltage of the conductors of the low-voltage AC circuit, for example between the conductors L1 and N (as illustrated).

It furthermore has a control unit in the form of a microprocessor MP, which is connected to the current unit SE1 and the voltage sensor SS, wherein the ascertained level of the current and the voltage of the low-voltage AC circuit are used by the microprocessor MP to ascertain a power value. An ascertained power value SLES may be output. By way of example, the ascertained power value may be displayed on the power measuring arrangement SLE or on the low-voltage circuit breaker LS, for example via a display unit connected to the control unit ETU or to the microprocessor MP. As an alternative or in addition, the power value may be transmitted by a communication unit connected to the control unit ETU or to the microprocessor MP (in a wireless or wired manner). As an alternative or in addition, the power value may be stored, accumulated or/and retrieved later.

The exemplary embodiment according to FIG. 2 shows a circuit with two conductors. Provision may be made, in the same way, for a three-phase AC circuit with or without a neutral conductor.

FIG. 3 shows an embodiment of a current unit SE1 according to FIG. 2 or FIG. 1. The embodiment has an analog integrator INT that is connected to the Rogowski coil RS1. The integrator is supplied with the analog voltage A1 of the Rogowski coil. An analog integrator is understood to mean an integrator that uses discrete components, such as capacitors, inductors, resistors, etc. to perform an integration, in accordance with analog circuit technology. In other words, an analog signal is integrated.

The analog integrator INT supplies an integrated analog voltage uc(t). In one variant, this is converted directly from analog to digital, that is to say by a first analog-to-digital converter ADU1, which outputs a digital signal P1 to the microprocessor MP.

In other embodiments according to the invention, a filter FI or/and amplifier V may be provided in any order between the analog integrator INT and the first analog-to-digital converter ADU1, as illustrated for example according to FIG. 3. As an alternative, a filter may also be provided upstream of the integrator INT.

As an alternative, the integrator may also be in the form of a digital integrator, with the first analog-to-digital converter then being arranged upstream of the integrator.

The microprocessor MP is designed such that the phase shift/phase error generated by the Rogowski coil RS1 and by the components connected downstream of the Rogowski coil, in particular the integrator INT, possibly the filter FI or/and amplifier V, is compensated for, wherein, for this purpose, the voltage values ascertained in the same way (as the current value ascertainment) are interpolated free from phase errors, thereby giving phase error-free power values.

FIG. 4 shows one embodiment of a voltage sensor SS according to FIG. 2 or FIG. 1. This has a second analog-to-digital converter ADU2 that outputs a digital signal PU/in each case a sample value of the voltage to the microprocessor MP.

A filter FI or/and amplifier or/and other units may be connected upstream of the second analog-to-digital converter ADU2, as illustrated for example in FIG. 4.

The invention is intended to be explained once more in other words below.

The measuring system that is usually used in a low-voltage circuit breaker consists of a Rogowski transformer (air-cored coil) as transducer and an analog integrator. The Rogowski coil is an open, toroidal air-cored coil having a linear characteristic. To acquire a current i(t) in a conductor, the coil, which is wound in circles, is placed around it. During the current measurement using a Rogowski coil, a voltage is induced in the coil, this voltage being proportional to the time derivative of the current di(t)/dt.

In order to obtain the signal from the Rogowski transformer in the original signal form prior to derivation by the converter, the signal has to be integrated. This is usually performed using an analog integrator (essentially a capacitor) within a current unit or control unit (electronics).

Both the Rogowski transformer and the integrator are not ideal units, but rather real units containing non-ideal components. Following the signal derivation by the Rogowski transformer and the subsequent integration by the analog integrator, there is a resultant residual phase error in relation to the original signal. This is a frequency-dependent phase error (phase response). In comparison therewith, the voltage measurement path usually consists only of linear components and therefore does not have any runtime or any phase errors.

The phase error in the current measurement path distorts these measured values. Resultant variables that are dependent on the angle between current and voltage are therefore also distorted or are inaccurate, for example the power values.

If the phase difference between the current and the voltage is large, for example in the range from 60 to 90°, then the error when ascertaining the power values is particularly large.

According to the invention, a linear interpolation method for digitally compensating for a phase error is provided in order to solve this problem. The compensation takes place on a signal converted from analog to digital in the time domain.

Since the underlying phase error is an angle error between the current and voltage signal, the compensation may take place both in the current signal and in the voltage signal. The angle compensation is advantageously performed in the voltage path, since this is generally less impacted by harmonics.

A new, interpolated voltage value u'(t) is calculated for each sample value of the voltage PU (each sample u(t)). Depending on the correction angle, this may be before or after the original sample/original sample value of the voltage PU in time. The new value u'(t) is advantageously calculated using the two-point form of the linear equation, as a result of which, in accordance with the intercept theorem, any point may be used to define a straight line between two points.

$$y = \frac{y_2 - y_1}{x_2 - x_1} * (x - x_1) + y_1$$

Depending on the required compensation angle, in order to calculate the new, interpolated voltage value (new sample) u'(t), use is made, in addition to the sample u(t), of the sample u(t−1) before it in time or the sample u(t+1) after it in time. The compensation method thus has a runtime of one sample. This constant runtime of one sample has to be taken into consideration when calculating the angle-dependent variables (power values), when forming the corresponding current/voltage sample value pairs.

Without the angle correction method (which may be implemented as an algorithm, in particular by way of firmware for the microprocessor), the value pairs would be temporally correlated with one another, that is to say p(t)=i(t)*u(t), wherein p(t) is power over time, i(t) is current over time and u(t) is voltage over time (in each case in the low-voltage circuit). The resultant "power sample value," respectively "power sample," at the time t is based on the current and voltage sample value, respectively samples, likewise at the time t.

The correction method has a runtime of one sample value/sample, that is to say the results always arrive from the control unit/the microprocessor delayed by one sample. In order to obtain the temporal correlation of the angle-corrected voltage samples with the current samples, the current samples likewise have to be delayed by one sample so that the temporal relationship matches.

The resultant "power samples" at the time t are based, from a temporal point of view, on the current and voltage samples that are (one sample) in the past $$p(t)=i(t+1)*u(t+1).$$

Due to the fact that the individual "power samples" are often combined or calculated to form a power result that is accumulated over a time window, this time shift does not play any (negative) role.

The angle compensation method proposed here makes it possible to achieve a considerable increase in the accuracy of the phase angle-dependent measured values or variables, for example the power values, with a low expenditure of system resources. The method allows a corresponding correction of the phase error individually in each measurement channel (for example per phase, that is to say per conductor L1, L2, L3, possibly N), as necessary.

The invention may advantageously be implemented at least partially by a computer program product comprising commands that, when the program is executed by a microprocessor, prompt said microprocessor to generate/to ascertain/to calculate an—at least roughly, i.e., substantially—phase error-free power value.

The computer program product may advantageously be stored on a non-transitory computer-readable storage medium, such as a CD, floppy disk, USB stick, flash drive, etc.

The computer program product may advantageously be transmitted by a data carrier signal, in order to allow fast installation of the firmware on the microprocessor.

Although the invention has been described and illustrated in more detail by way of the exemplary embodiment, the invention is not restricted by the disclosed examples and other variations may be derived therefrom by a person skilled in the art without departing from the scope of protection of the invention.

The invention claimed is:

1. A low-voltage circuit breaker for a low-voltage AC circuit, the circuit breaker comprising:
    a voltage sensor for ascertaining a voltage between conductors of the low-voltage AC circuit;
    a Rogowski coil for ascertaining an electric current of a conductor of the low-voltage AC circuit, the Rogowski coil outputting an analog voltage that is an equivalent of a level of the electric current of the conductor;
    an interruption unit having contacts for interrupting the low-voltage AC circuit;
    a control unit connected to said voltage sensor, to said Rogowski coil, and to said interruption unit, said control unit having a microprocessor, wherein the low-voltage AC circuit is interrupted when at least one of a current limit value or a current/time period limit value of a conductor are exceeded;
    said Rogowski coil being connected to an analog integrator followed by a first analog-to-digital converter configured to convert an integrated analog voltage into a digital signal, to provide a sample value of the current every X degrees, in relation to the period duration of the AC current;

said voltage sensor being connected to a second analog-to-digital converter, providing a sample value of the voltage every Y degrees, in relation to the period duration of the AC voltage, with the sample value of the voltage corresponding to a level of the voltage or an equivalent of the level of the voltage at the respective time; and wherein a power value is calculated in each case from a sample value of the current and an interpolated voltage value, the interpolated voltage value in each case being ascertained from two successive sample values of the voltage such that a phase error generated by at least one of the Rogowski coil or the integrator is compensated for in relation to the electric current in the conductor, to ascertain an at least substantially phase error-free power value.

2. The low-voltage circuit breaker according to claim 1, wherein the interpolated voltage values are ascertained by way of a linear interpolation.

3. The low-voltage circuit breaker according to claim 2, wherein said control unit is configured to perform the interpolation.

4. The low-voltage circuit breaker according to claim 1, wherein said control unit includes the microprocessor configured to perform an interpolation to ascertain the interpolated voltage values.

5. The low-voltage circuit breaker according to claim 1, wherein the sample value of the current and the sample value of the voltage are ascertained concurrently.

6. The low-voltage circuit breaker according to claim 1, wherein the sample value of the current and the sample value of the voltage are ascertained substantially concurrently.

7. The low-voltage circuit breaker according to claim 1, wherein the sample value of the current and the sample value of the voltage are ascertained at an equal sampling rate, and a time difference between the sample values of the current and the sample values of the voltage is equal or is equal on average.

8. The low-voltage circuit breaker according to claim 1, wherein the phase error of the current is ascertained and the ascertained phase error is used to ascertain the interpolated voltage value.

9. The low-voltage circuit breaker according to claim 1, wherein:
a phase error of the current is ascertained for the circuit breaker when the low-voltage circuit breaker is put into service; and
a phase position of the interpolated voltage value is set such that at least substantially phase error-free power values are ascertained.

10. The low-voltage circuit breaker according to claim 9, wherein the phase position of the interpolated voltage value is set when the low-voltage circuit breaker is put into service.

11. A power measuring arrangement for a low-voltage AC circuit, the measuring arrangement comprising:
a voltage sensor for ascertaining a level of a voltage between conductors of the low-voltage AC circuit;
a Rogowski coil for ascertaining a level of an electric current of a conductor of the low-voltage AC circuit, the Rogowski coil outputting an analog voltage that is an equivalent of the level of the electric current of the conductor;
a control unit connected to said voltage sensor and to said Rogowski coil, said control unit having a microprocessor;
said Rogowski coil being connected to an analog integrator and a following first analog-to-digital converter configured to convert an integrated analog voltage) into a digital signal, to provide a sample value of the current for every X degrees, in relation to a period duration of the AC current;
said voltage sensor being connected to a second analog-to-digital converter, to provide a sample value of the voltage every Y degrees, in relation to the period duration of the AC voltage, the sample value of the voltage corresponding to the level of the voltage or an equivalent of the level of the voltage at the respective time; and
wherein a power value is calculated in each case from a sample value of the current and an interpolated voltage value, the interpolated voltage value in each case being ascertained from two successive sample values of the voltage to compensate for a phase error generated by at least one of said Rogowski coil or said integrator in relation to the electric current in the conductor, and to ascertain an at least substantially phase error-free power value.

12. A method for ascertaining a power value for a low-voltage AC circuit, the method comprising:
ascertaining a level of a voltage between conductors of the low-voltage AC circuit;
ascertaining a level of a current of at least one conductor of the low-voltage AC circuit by a Rogowski coil, and outputting with the Rogowski coil an analog voltage that is an equivalent of the level of the electric current of the at least one conductor;
integrating the analog voltage of the Rogowski coil and then digitizing the integrated analog voltage, to provide a sample value of the current or an equivalent thereof every X degrees, in relation to a period duration of the AC current;
digitizing the level of the voltage to provide a sample value of the voltage or an equivalent thereof every Y degrees, in relation to the period duration of the AC voltage; and
calculating a power value in each case from a sample value of the current and an interpolated voltage value, the interpolated voltage value being ascertained from two successive sample values of the voltage such that a phase error generated by at least one of the Rogowski coil or the integrator is compensated for in relation to the electric current in the conductor, to ascertain an at least substantially phase error-free power value.

13. The method according to claim 12, configured for ascertaining a power value for a low-voltage circuit breaker.

14. A computer program product, comprising non-transitory program code with commands that, when the program is executed by a microprocessor, prompt the microprocessor to perform the method according to claim 12 and to generate a substantially phase error-free power value.

15. A computer-readable storage medium storing thereon the computer program product according to claim 14 in non-transitory form.

* * * * *

UNITED STATES PATENT AND TRADEMARK OFFICE
CERTIFICATE OF CORRECTION

PATENT NO. : 11,784,486 B2
APPLICATION NO. : 17/680628
DATED : October 10, 2023
INVENTOR(S) : Peter Kopaczewski et al.

It is certified that error appears in the above-identified patent and that said Letters Patent is hereby corrected as shown below:

In the Claims

Columns 11-12, Claim 11 should read as follows:

11. A low-voltage circuit breaker for a low-voltage AC circuit, the circuit breaker comprising:

a voltage sensor for ascertaining a voltage between conductors of the low-voltage AC circuit;

a Rogowski coil for ascertaining an electric current of a conductor of the low-voltage AC circuit, the Rogowski coil outputting an analog voltage that is an equivalent of a level of the electric current of the conductor;

a control unit connected to said voltage sensor and to said Rogowski coil, said control unit having a microprocessor;

said Rogowski coil being connected to an analog integrator and a following first analog-to-digital converter configured to convert an integrated analog voltage into a digital signal, to provide a sample value of the current for every X degrees, in relation to a period duration of the AC current;

said voltage sensor being connected to a second analog-to-digital converter, to provide a sample value of the voltage every Y degrees, in relation to the period duration of the AC voltage, the sample value of the voltage corresponding to the level of the voltage or an equivalent of the level of the voltage at the respective time; and wherein a power value is calculated in each case from a sample value of the current and an interpolated voltage value, the interpolated voltage value in each case being ascertained from two successive sample values of the voltage to compensate for a phase error generated by at least one said Rogowski coil or said integrator in relation to the electric current in the conductor, and to ascertain an at least substantially phase error-free power value.

Signed and Sealed this
Twenty-first Day of November, 2023

Katherine Kelly Vidal
*Director of the United States Patent and Trademark Office*